(12) United States Patent
Forbes et al.

(10) Patent No.: US 7,359,241 B2
(45) Date of Patent: Apr. 15, 2008

(54) IN-SERVICE RECONFIGURABLE DRAM AND FLASH MEMORY DEVICE

(75) Inventors: Leonard Forbes, Corvallis, OR (US); Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 11/435,621

(22) Filed: May 17, 2006

(65) Prior Publication Data

US 2006/0221670 A1   Oct. 5, 2006

Related U.S. Application Data

(62) Division of application No. 10/894,101, filed on Jul. 19, 2004, now Pat. No. 7,190,616.

(51) Int. Cl.
*G11C 11/34* (2006.01)
(52) U.S. Cl. .................. 365/185.05; 365/185.08; 365/185.17; 365/185.01; 365/63
(58) Field of Classification Search .......... 365/185.05, 365/185.08, 185.17, 185.01, 63
See application file for complete search history.

(56) References Cited

U.S. PATENT DOCUMENTS

| 5,331,188 | A | 7/1994 | Acovic |
| 6,166,407 | A | 12/2000 | Ohta |
| 6,594,192 | B1 | 7/2003 | McClure |
| 6,771,538 | B2 | 8/2004 | Shukuri |
| 6,781,916 | B2 | 8/2004 | McClure |
| 6,798,008 | B2 | 9/2004 | Choi |
| 7,158,410 | B2 * | 1/2007 | Bhattacharyya et al. ............. 365/185.08 |
| 7,190,616 | B2 * | 3/2007 | Forbes et al. .......... 365/185.05 |
| 2006/0044870 | A1 * | 3/2006 | Bhattacharyya et al. ............. 365/185.08 |
| 2006/0146594 | A1 * | 7/2006 | Bhattacharyya et al. .... 365/149 |
| 2006/0146605 | A1 * | 7/2006 | Bhattacharyya et al. ............. 365/185.08 |
| 2006/0146606 | A1 * | 7/2006 | Bhattacharyya et al. ............. 365/185.08 |
| 2006/0152962 | A1 * | 7/2006 | Bhattacharyya et al. .... 365/149 |
| 2006/0176726 | A1 * | 8/2006 | Bhattacharyya et al. .... 365/149 |

* cited by examiner

*Primary Examiner*—Viet Q. Nguyen
(74) *Attorney, Agent, or Firm*—Leffert Jay & Polglaze, P.A.

(57) ABSTRACT

A memory cell that has both a DRAM cell and a non-volatile memory cell. The non-volatile memory cell might include a flash memory or an NROM cell. The memory cell is comprised of a vertical floating body transistor with dual gates, one on either side of a vertical pillar of a substrate. One gate is a polysilicon gate and gate insulator that is adjacent to the floating body of the transistor and acts as a DRAM cell. The non-volatile memory cell is constructed on the other side of the pillar with a floating gate or NROM structure. The DRAM and non-volatile cells are linked by a drain region coupling the two cells to a memory array bitline. The bottom of trenches on either side of the pillar have source regions that are linked to respective source lines of the memory array.

12 Claims, 3 Drawing Sheets

IN-SERVICE RECONFIGURABLE DRAM AND FLASH MEMORY DEVICE

RELATED APPLICATION

This Application is a Divisional of U.S. application Ser. No. 10/894,101, titled "IN-SERVICE RECONFIGURABLE DRAM AND FLASH MEMORY DEVICE," filed Jul. 19, 2004, now U.S. Pat. No. 7,190,616 which is commonly assigned and incorporated herein by reference.

TECHNICAL FIELD OF THE INVENTION

The present invention relates generally to memory devices and in particular the present invention relates to NROM/flash memory and DRAM devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. If memory devices are to continue meeting consumer needs, improvements in speed, cost, and size need to continue.

DRAM devices are typically used as the main data memory for computers due to its relatively low cost and high speeds for reading and writing. However, when power is removed, DRAM loses its data. DRAM cells must also be refreshed periodically to keep the data intact.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems. Flash memory devices can retain data even after power has been removed and flash memory cells do not require time-consuming refresh operations. Flash memory, however, is substantially more expensive than DRAM and is slow for both read and write operations.

For the reasons stated above, and for other reasons stated below which will become apparent to those skilled in the art upon reading and understanding the present specification, there is a need in the art for a memory device having the benefits of both non-volatile memory and DRAM devices.

DETAILED DESCRIPTION

Figure 1:
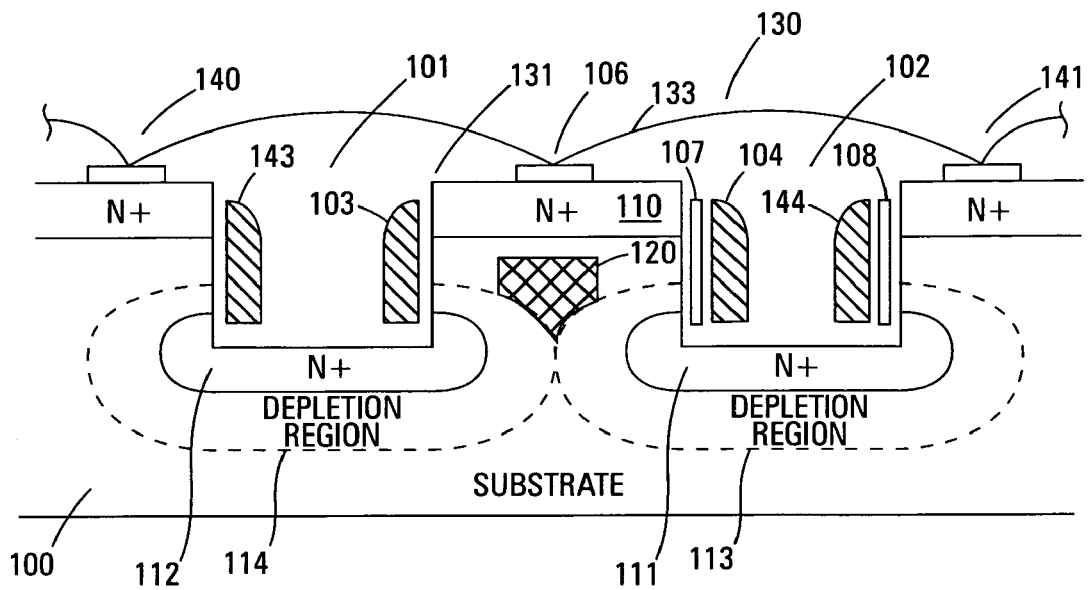
FIG. 1 shows a cross-sectional view of one embodiment of a vertical memory device of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including gallium arsenide (GaAs), germanium, carbon, silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates a cross-sectional view of one embodiment of a vertical memory cell of the present invention. In this embodiment, the structure is comprised of a floating body transistor 120 with dual gates 103 and 104. The floating body transistor 120 is used as a high gain dynamic random access memory cell 131. A flash memory device 130 is constructed on the other side of the pillar 106. The memory cell of the present invention can either be a conventional flash memory with a floating gate or an NROM device. The functionality of each cell of the array is user selectable while the memory device is operating.

The vertical memory device of FIG. 1 is comprised of trenches 101 and 102 formed in a bulk silicon substrate 100. In one embodiment, the substrate is a p-type silicon that is doped with n+ regions 110-112 that act as source/drain regions. However, the present invention is not limited to any one conductivity type.

The drain regions 110 are coupled by a data/bitline 130. The bitline 130 is coupled to the drain region in the top of each pillar 106, 140, and 141.

During operation, the n+ doped regions 111 and 112 at the bottom of the trenches form depletion regions 113 and 114 respectively. A floating body 120 is located at the overlap of the depleted regions 113 and 114 and results from the partial depletion.

The DRAM cells 131 are comprised of a polysilicon layer 103 and 143 that is formed over the sidewalls of a trench 101. These layers 103 and 143 form the control gates/wordlines of the DRAM cells 131. In one embodiment, an oxide dielectric layer is formed between the polysilicon gates 103 and 143 and the trench sidewalls.

The flash memory cells 130 are comprised of a floating gate layer 107 and 108 that is formed along the trench 102 sidewalls. A polysilicon control gate layer 104 and 144 is formed over the floating gate. The control gates 104 and 144 are coupled to the address/wordlines of the array.

Gate and intergate dielectric layers are formed between the trench sidewalls and the floating gate 107 and 108 and control gates 104 and 144 respectively. In one embodiment, these dielectric layers are an oxide material.

The flash memory cell 130, in one embodiment, is a nitride read only memory (NROM) flash memory device that employs charge trapping in a silicon nitride layer. The gate insulator in this embodiment can be an oxide-nitride-oxide structure. NROM devices can be implemented with a CMOS process.

Alternate embodiments of the present invention use other gate insulators besides the ONO composite structure described. These structures may include oxide-nitride-aluminum oxide composite layers, oxide-aluminum oxide-oxide composite layers, oxide, silicon oxycarbide-oxide composite layers as well as other composite layers.

In still other alternate embodiments, the gate insulator may include thicker than normal silicon oxides formed by wet oxidation and not annealed, silicon rich oxides with inclusions of nanoparticles of silicon, silicon oxynitride layer that are not composite layers, silicon rich aluminum oxide insulators that are not composite layers, silicon oxycarbide insulators that are not composite layers, silicon oxide insulators with inclusions of nanoparticles of silicon carbide, in addition to other non-stoichiometric single layers of gate insulators of two or more commonly used insulator materials such as Si, N, Al, Ti, Ta, Hf, Zr, and La. The present invention is not limited to any one type of NROM architecture.

For purposes of clarity, only one substrate pillar 106 with the resulting DRAM cell 131 and flash/NROM cell 130 are shown and described. It is well known in the art that a memory array can be comprised of a large number of these structures.

Figure 2:
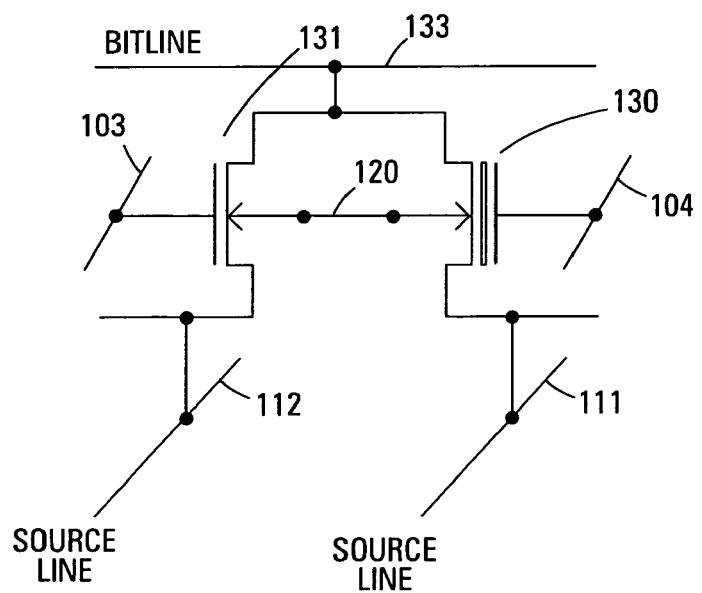
FIG. 2 shows an electrical equivalent circuit in accordance with the embodiment of FIG. 1.

FIG. 2 illustrates an equivalent electrical circuit schematic of the vertical embodiment of FIG. 1. Both the flash/NROM cell 130 and the DRAM cell 131 are shown. The floating body 120 is formed between the two cells.

The drain regions of each cell 130 and 131 are coupled together and further coupled to the bitline 133. The control gates of each cell 130 and 131 are coupled to their respective wordlines 104 and 103. The DRAM cells of the array are coupled to separate wordlines from the flash/NROM cells of the array. The source regions of FIG. 1 are connected to the array source lines 111 and 112.

While the embodiment of FIG. 2 illustrates a NOR architecture memory array, the present invention is not limited to this type of architecture. For example, an alternate embodiment may employ wiring and bias techniques to make a NAND architecture memory array.

Figure 3:
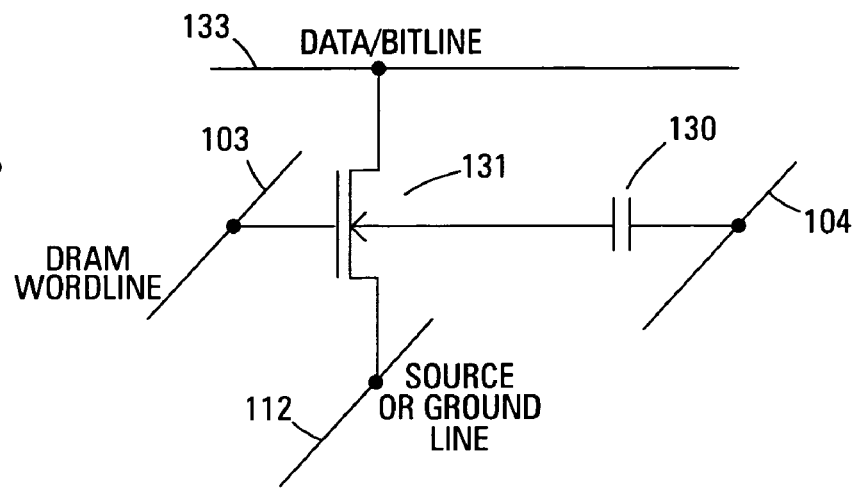
FIG. 3 shows an electrical schematic of one implementation of the vertical memory device of the present invention.

FIG. 3 illustrates an electrical schematic of an implementation of the vertical DRAM/flash/NROM memory cell structure of the present invention. In this embodiment, the cell is a separate floating body DRAM cell 131.

When the DRAM cell 131 is selected, the flash/NROM portion is inactive. The control gate on the flash/NROM 130 has a capacitive coupling to the floating body that, in one embodiment, may be used for programming the floating body DRAM cell 131. In another embodiment, the control gate 104 of the flash/NROM is grounded or biased negatively such that it is used to increase the storage capacitance of the floating body. The control gate 104 of the flash/NROM can also be biased with a positive voltage on a transient basis in order to assist in erasing the DRAM cell 131.

The control gate of the DRAM cell 131 is coupled to an array wordline 103. The source region of the cell 131 is coupled to the source line or ground line 112 and the drain region is coupled to a data/bitline 133 of the array.

The floating body DRAM cell 131 can be read/sensed from the cell 131 when a positive voltage in excess of the normal threshold voltage (e.g., 0.6V) is applied to the gate of the cell 131 through the DRAM wordline 103. This voltage will turn on the floating body transistor and determine the conductivity state. If the floating body is not charged with holes, the threshold voltage will be the normal higher value and the transistor will not be very conductive and will pull the bitline 133 down only very slowly. If the floating body is charged to a positive charge state and potential, the threshold voltage of the transistor will be lower (e.g., 0.3V) and the transistor will turn on and be in a very conductive state. This pulls down the bitline in a sub-nanosecond time period. The sense amplifier subsequently responds, after predetermined time, with a sensed voltage in response to the charge stored on the floating body. Once the sense amplifier has sensed the potential on the bitline 133, the appropriate data value may be output.

To write data into the DRAM cell 131 and a positive charge onto the floating body, a large positive voltage (e.g., 5-9V) is applied to the drain of the floating body transistor through the bitline 133 while biasing the DRAM wordline 103 with a positive voltage. The data is written onto the floating body as a positive charge composed of holes generated by impact ionization and multiplication in the drain depletion region by high electric fields.

Figure 4:
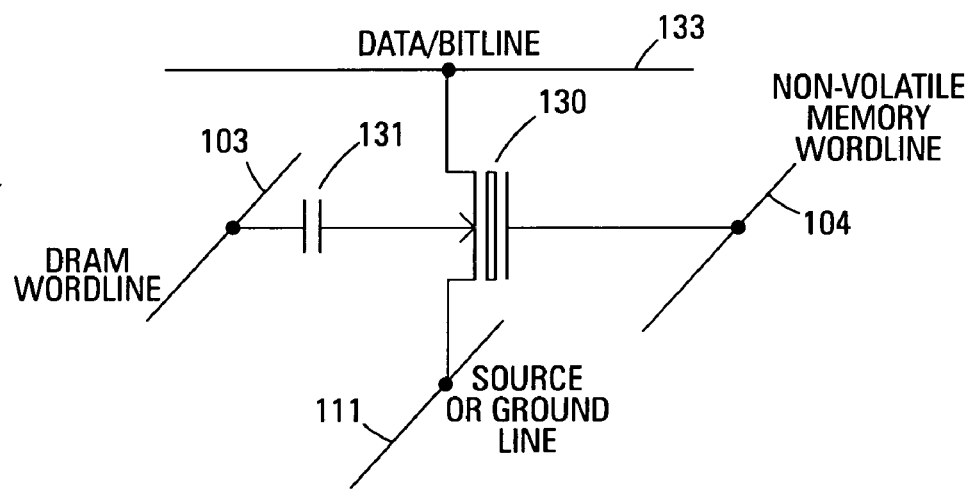
FIG. 4 shows an electrical schematic of another implementation of the vertical memory device of the present invention.

FIG. 4 illustrates an electrical schematic of another implementation of the vertical DRAM/flash/NROM memory cell structure of the present invention. In this embodiment, the structure is used as a flash memory cell or NROM cell 130. In such an implementation, the DRAM 131 gate and wordline 103 are grounded.

In this embodiment, the drain regions of the flash/NROM cell 130 are coupled to a data/bitline 133 of the memory array. The source regions are coupled to the source line or ground line 111. The control gate is coupled to a flash address/wordline 104.

In order to access the data in the non-volatile cell 130, a voltage that is approximately equal to the threshold voltage of the cell (e.g., 0.6 V) is applied to the non-volatile memory wordline 104. This causes the charge stored on the floating gate region to be amplified and reflected on the bitline 133 and, thereafter, to the sense amplifier.

The flash/NROM cell 130 can be programmed by channel hot electron injection or any other programming technique. The cell 130 can be erased by applying a large negative control gate voltage (e.g., −7 to −10V) and tunneling of electrons off of the floating gate or out of the nitride layer, depending on the implementation. Alternate embodiments may use other erase techniques.

Figure 5:
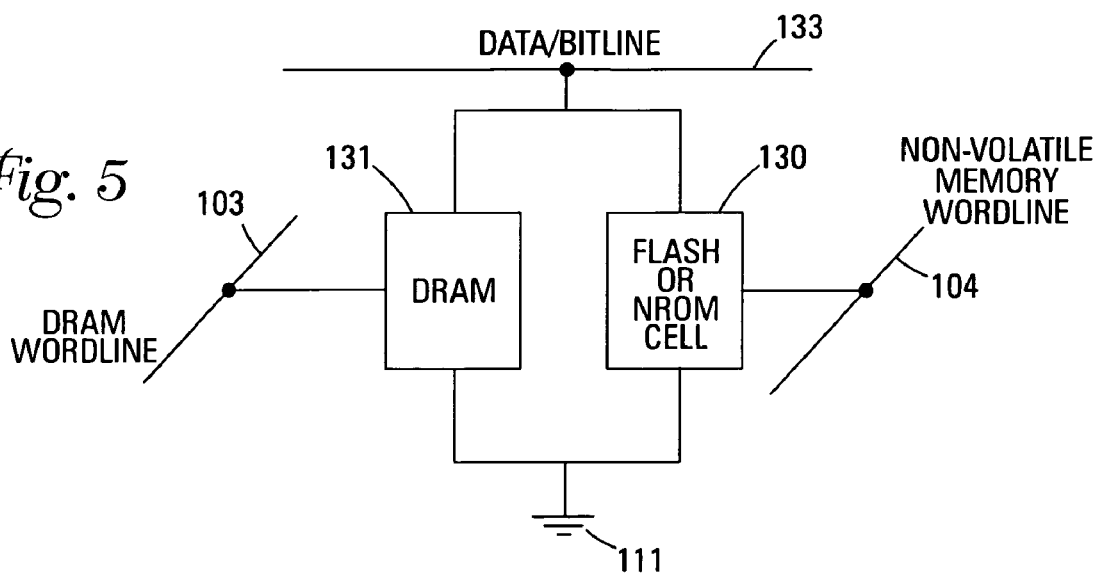
FIG. 5 shows an electrical schematic of yet another implementation of the vertical memory device of the present invention.

FIG. 5 illustrates an electrical schematic of yet another implementation of the vertical DRAM/flash/NROM memory cell structure of the present invention. In this embodiment, the structure is used as both a DRAM cell 131 and a non-volatile memory cell 130 (e.g., flash/NROM).

In one embodiment, the DRAM 131 might be used to store data under normal operating conditions. When a power loss occurs or during shutdown of the system, the data can be read from the DRAM cell 131 and written into the flash/NROM cell 130. In other words, the cell structure can be user configured dynamically during different time periods to act as first a volatile DRAM element then a non-volatile flash/NROM element. The data may be stored outside the array while the DRAM cell is disabled and the non-volatile cell is enabled.

In another embodiment, the structure can begin operating as a non-volatile flash/NROM element in which default data is stored during a power-off period. Upon initialization, the data is read from the flash/NROM element and transferred to the DRAM cell. This embodiment again dynamically reconfigures the structure during operation of the memory device. The data may be stored outside the array while the non-volatile cell is disabled and the DRAM cell is enabled.

In the embodiment of FIG. 5, the flash/NROM control gate is coupled to the memory array's flash/NROM wordline 104 while the structure is in the flash/NROM mode. When the structure is in the DRAM mode, the DRAM control gate is coupled to the memory array's DRAM wordline 103. Otherwise, the cells are configured as disclosed in FIGS. 3 and 4 above.

The drain region is coupled to the data/bitline 133 of the memory array. The source region is coupled to ground 111.

Figure 6:
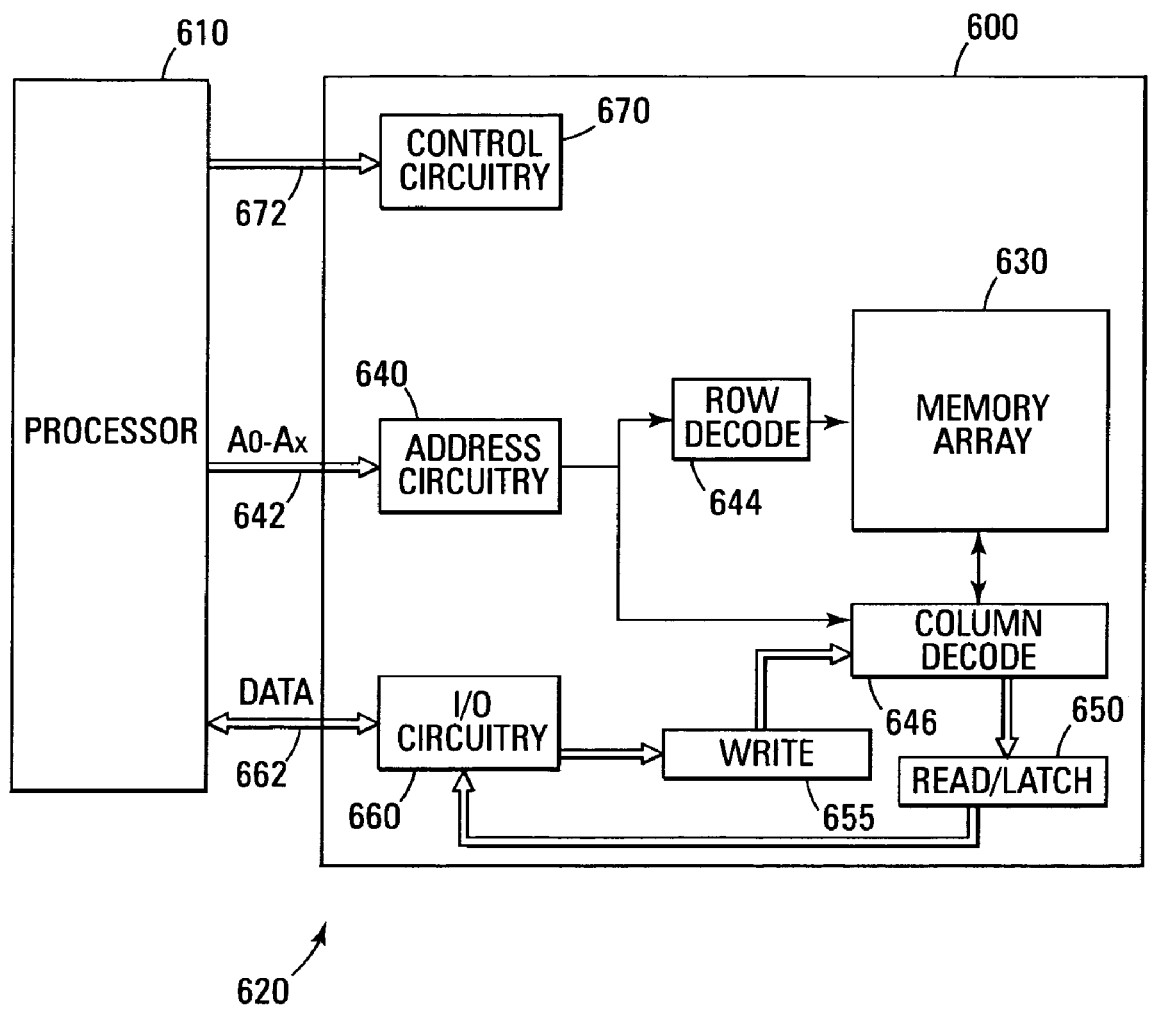
FIG. 6 shows a block diagram of one embodiment of an electronic system of the present invention.

FIG. 6 illustrates a functional block diagram of a memory device 600 that can incorporate the DRAM/flash/NROM vertical memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of memory cells 630 as described above in the various embodiments of the present invention. The memory array 630 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 can further control changing the vertical structure of the present invention from one type of cell (e.g., DRAM) to another type of cell (e.g., flash/NROM). The control circuitry 670 may be a state machine, a sequencer, or some other type of controller.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the vertical memory cell of the present invention provides the capability for operating as either a DRAM cell or a flash/NROM cell. The embodiments of the present invention can perform the reconfiguration as an in-service switch between one type of cell to the other type of cell. The vertical structure provides this capability using less real estate than a planar structure.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for operating a memory array in a DRAM mode, the array comprising a plurality of vertical memory cells each having a DRAM cell and a non-volatile memory cell, the DRAM cell having a source region, a drain region coupled to an array bitline, and a control gate coupled to a DRAM wordline, the non-volatile memory cell comprising a source region, a drain region, and a control gate coupled to a non-volatile memory wordline, the method comprising:
    grounding the non-volatile memory wordline; and
    coupling the DRAM cell source region to a memory array source line.

2. The method of claim 1 wherein the memory array source line is grounded.

3. The method of claim 1 and further including writing data to the DRAM cell by:
    biasing the DRAM wordline with a positive programming voltage; and
    applying the data to the array bitline.

4. The method of claim 3 wherein the programming voltage is greater than 10V.

5. The method of claim 1 and further including reading data from the DRAM cell by:
    biasing the DRAM wordline with a positive read voltage; and
    sensing the data on the array bitline.

6. The method of claim 5 wherein the positive read voltage is greater than 0.5V.

7. A method for operating a memory array in a non-volatile memory mode, the array comprising a plurality of vertical memory cells each having a DRAM cell and a non-volatile memory cell, the DRAM cell having a source region, a drain region, and a control gate coupled to a DRAM wordline, the non-volatile memory cell comprising a source region, a drain region coupled to an array bitline, and a control gate coupled to a non-volatile memory wordline, the method comprising:
    grounding the DRAM wordline; and
    coupling the non-volatile memory cell source region to a memory array source line.

8. The method of claim 7 wherein the memory array source line is grounded.

9. The method of claim 7 and further including writing data to the non-volatile memory cell by:
   biasing the non-volatile memory wordline with a positive programming voltage; and
   applying the data to the array bitline.

10. The method of claim 9 wherein the positive programming voltage is greater than 10V.

11. The method of claim 7 and further including reading data from the non-volatile memory cell by:
    biasing the non-volatile memory wordline with a positive read voltage; and
    sensing the data on the array bitline.

12. The method of claim 11 wherein the positive read voltage is greater than 0.5V.

* * * * *